US008864377B2

(12) United States Patent
Wong et al.

(10) Patent No.: US 8,864,377 B2
(45) Date of Patent: Oct. 21, 2014

(54) CMOS TEMPERATURE SENSOR WITH SENSITIVITY SET BY CURRENT-MIRROR AND RESISTOR RATIOS WITHOUT LIMITING DC BIAS

(75) Inventors: Chun Fai Wong, Hong Kong (HK); Leung Ling (Alan) Pun, Hong Kong (HK); Kam Hung Chan, Hong Kong (HK); Kwok Kuen (David) Kwong, Davis, CA (US)

(73) Assignee: Hong Kong Applied Science & Technology Research Institute Company Limited, Hong Kong (HK)

( * ) Notice: Subject to any disclaimer, the term of this patent is extended or adjusted under 35 U.S.C. 154(b) by 433 days.

(21) Appl. No.: 13/416,728

(22) Filed: Mar. 9, 2012

(65) Prior Publication Data

US 2013/0235903 A1    Sep. 12, 2013

(51) Int. Cl.
*G01K 7/01* (2006.01)

(52) U.S. Cl.
USPC ........................................... 374/178; 327/513

(58) Field of Classification Search
USPC ........................................... 374/178; 327/513
See application file for complete search history.

(56) References Cited

U.S. PATENT DOCUMENTS

| 7,010,440 | B1 * | 3/2006 | Lillis et al. ........................ 702/65 |
| 7,256,643 | B2 * | 8/2007 | Pan et al. ........................ 327/539 |
| 7,368,973 | B2 | 5/2008 | Sato |
| 7,486,065 | B2 * | 2/2009 | Lin et al. ........................ 323/313 |
| 7,686,508 | B2 * | 3/2010 | Lin et al. ........................ 374/178 |
| 7,857,510 | B2 | 12/2010 | Liepold et al. |
| 2005/0074051 | A1 * | 4/2005 | Won et al. ........................ 374/170 |
| 2006/0262827 | A1 * | 11/2006 | Hsu ........................ 374/1 |
| 2006/0267668 | A1 * | 11/2006 | Porter ........................ 327/512 |
| 2008/0031304 | A1 * | 2/2008 | Nishimura ........................ 374/178 |
| 2008/0259990 | A1 * | 10/2008 | Takeuchi ........................ 374/1 |
| 2008/0285624 | A1 | 11/2008 | Igarashi |
| 2009/0146725 | A1 | 6/2009 | Kimura |
| 2009/0243713 | A1 * | 10/2009 | Marinca ........................ 327/542 |
| 2009/0256623 | A1 * | 10/2009 | Tajima ........................ 327/512 |
| 2011/0267133 | A1 * | 11/2011 | Kumar ........................ 327/512 |
| 2012/0183017 | A1 * | 7/2012 | Schnaitter ........................ 374/178 |
| 2013/0009680 | A1 * | 1/2013 | Cho et al. ........................ 327/156 |

\* cited by examiner

*Primary Examiner* — Mirellys Jagan
(74) *Attorney, Agent, or Firm* — Stuart T. Auvinen; gPatent LLC (57) ABSTRACT

An on-chip temperature sensor circuit can be implemented in a standard complementary metal-oxide-semiconductor (CMOS) process using PNP transistors. A pair of transistors have collector currents that are sensitive to voltage, both directly and due to saturation currents. A scaling resistor connects to the emitter of one transistor and its voltage compared to the other transistor's emitter voltage by an error amplifier that generates a bias voltage to current sources that are proportional to absolute temperature since the saturation current sensitivity is subtracted out. The current is mirrored to sink current through a multiplier resistor from an output. An amplifier connected across the multiplier resistor compares a reference voltage to set the DC bias independent of temperature sensitivity. The temperature sensitivity is proportional to the ratio of the multiplier resistor and the scaling resistor, and is multiplied by a mirroring factor. A differential output may also be provided.

14 Claims, 7 Drawing Sheets

CMOS TEMPERATURE SENSOR WITH SENSITIVITY SET BY CURRENT-MIRROR AND RESISTOR RATIOS WITHOUT LIMITING DC BIAS

FIELD OF THE INVENTION

This invention relates to temperature sensors, and more particularly to on-chip CMOS temperature sensor circuits.

BACKGROUND OF THE INVENTION

High levels of integration of circuits has produced large chips that can perform many tasks. However, the tightly packed transistors generate heat, especially at higher operating frequencies. Hotspots on the chip can cause erratic circuit function or even permanent damage.

Temperature-monitoring circuits can be added to the integrated circuit (IC) chip. Such on-chip temperature monitor circuits may detect high temperatures and activate a power controller to power down some or all of the chip's circuits, or perhaps reduce the operating frequency. Once the temperature falls sufficiently, the circuits may be powered back up or resume operation.

Ideally such temperature monitoring circuits use the same process technology as the other circuits on the chip. However, some temperature monitoring circuits require a more expensive BiCMOS technology rather than standard complementary metal-oxide-semiconductor (CMOS).

Figure 1:
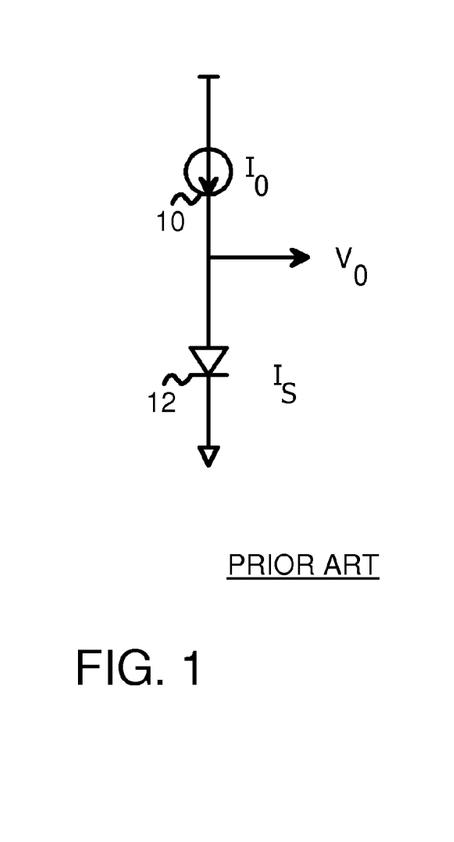
FIG. 1 shows a simple prior art temperature monitoring circuit.

FIG. 1 shows a simple prior art temperature monitoring circuit. Current source 10 drives a constant current $I_0$ to diode 12, which sinks a current to produce an output voltage $V_O$. The current through diode 12 is related to the base-emitter diode junction voltage, $V_{BE}$, as:

$$V_{BE}=(kT/q)\ln(I_C/I_S)$$

where k is Boltzman's constant, T is the absolute temperature, q is the elementary charge, $I_C$ is the collector current through diode 12, and $I_S$ is the saturation current. Unfortunately, the saturation current itself also varies with temperature, so two variables depend on temperature, T and $I_S$.

The output voltage $V_O$ is equal to the base-emitter junction voltage, such as 0.6 volts, plus a temperature-sensitive term of about −2 mV per degree Kelvin, or −2 mV/K. This sensitivity to temperature is fixed by the manufacturing process.

A drawback of the simple circuit in FIG. 1 is that a constant current source 10 is needed. Linearity of the output voltage with temperature can be degraded due to non-ideal characteristics of real current sources. Also, the amount of temperature sensitivity is relatively small. The temperature sensitivity of the saturation current $I_S$ also introduces non-linearities to the temperature sensor.

Figure 2:
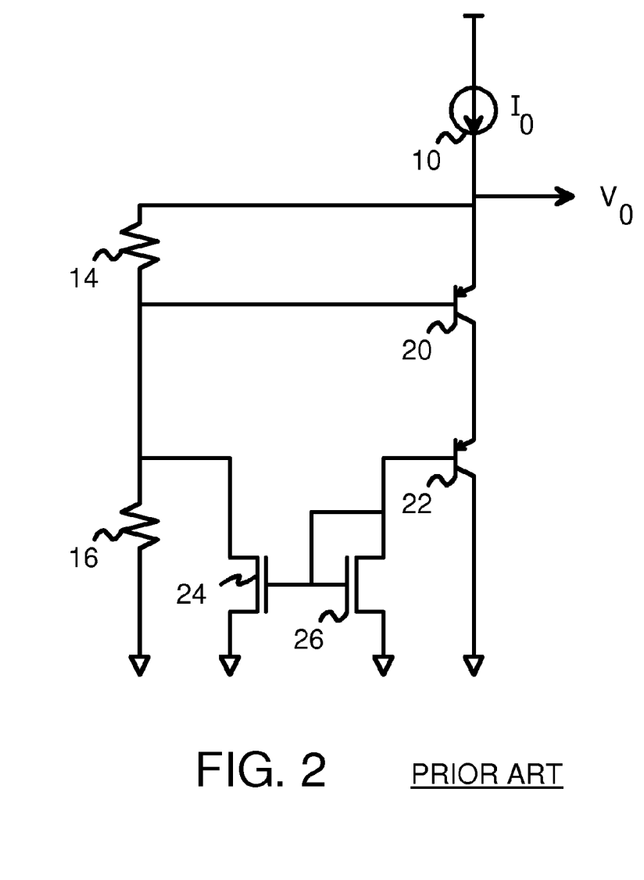
FIG. 2 shows another prior art temperature sensing circuit.

FIG. 2 shows another prior art temperature sensing circuit. The temperature sensitivity can be scaled by the ratio of resistors 16, 14, allowing for greater temperature sensitivity. See U.S. Pat. No. 7,368,973 to Sato et al. A base current cancellation circuit includes transistors 22, 24, 26, while transistor 20 is used rather than a diode to generate $V_O$. The output voltage $V_O=(0.6V-2 mV/K)*(1+R16/R14)$. Thus the temperature sensitivity is scaled by resistor ratio R16/R14.

Unfortunately, an ideal current source 10 is still needed, and a BiCMOS process is used. Linearity is degraded since the saturation current term cannot be cancelled. Also, the voltage headroom is reduced due to the number of stacked transistors. This reduced headroom can be a problem for reduced power-supply voltages.

What is desired is an improved temperature sensing circuit. A temperature sensing circuit that does not require BiCMOS but uses a standard CMOS process is desired. A temperature sensor that scales temperature sensitivity using a resistor ratio, a current-mirror ration, or other methods, but does not have a reduced voltage headroom is desirable. A temperature sensor that does not require an ideal current source, and than can cancel the saturation current term is also desirable.

DETAILED DESCRIPTION

The present invention relates to an improvement in temperature sensing circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
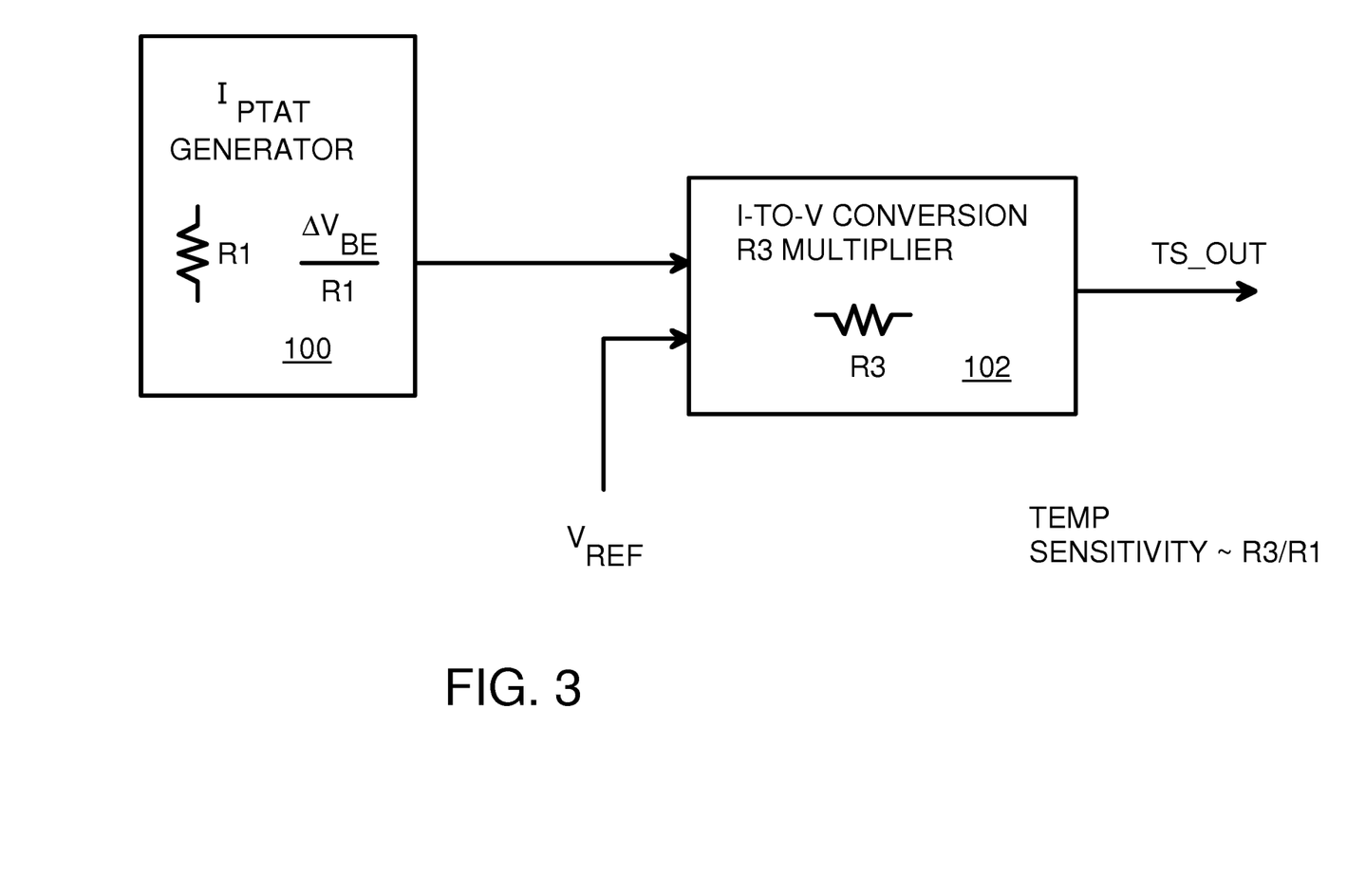
FIG. 3 is a block diagram of a temperature sensing circuit.

FIG. 3 is a block diagram of a temperature sensing circuit. $I_{PTAT}$ generator 100 is a circuit that generates a current that is Proportional To Absolute Temperature (PTAT). However, rather than use a single diode, or a single base-emitter junction in a transistor, two transistors are used, and the resulting voltages subtracted from each other.

The inventors use two base-emitter junctions and then compare the generated voltages to get a difference in base-emitter voltages, $\Delta V_{BE}$. The non-linearities caused by the temperature dependencies of the saturation currents of the two diode junctions can cancel each other out when the voltages are subtracted.

The current from $I_{PTAT}$ generator 100 is converted to a voltage by second stage 102, which includes a current-to-voltage converter. Also, the converted voltage is multiplied by resistor R3. Another resistor R1 in $I_{PTAT}$ generator 100 divides the $I_{PTAT}$ current. Thus the output voltage TS_OUT is scaled by the resistor ratio R3/R1. This scaling based on the resistor ratio can be very accurate and any non-linearities due to temperature dependency of saturation current $I_S$ in diodes or transistor junctions cancel out.

The reference voltage $V_{REF}$ is used to set the DC bias level of TS_OUT. The DC bias can be set independent of the resistor ratio and temperature sensitivity. Thus voltage headroom is not reduced as sensitivity is increased.

Figure 4:
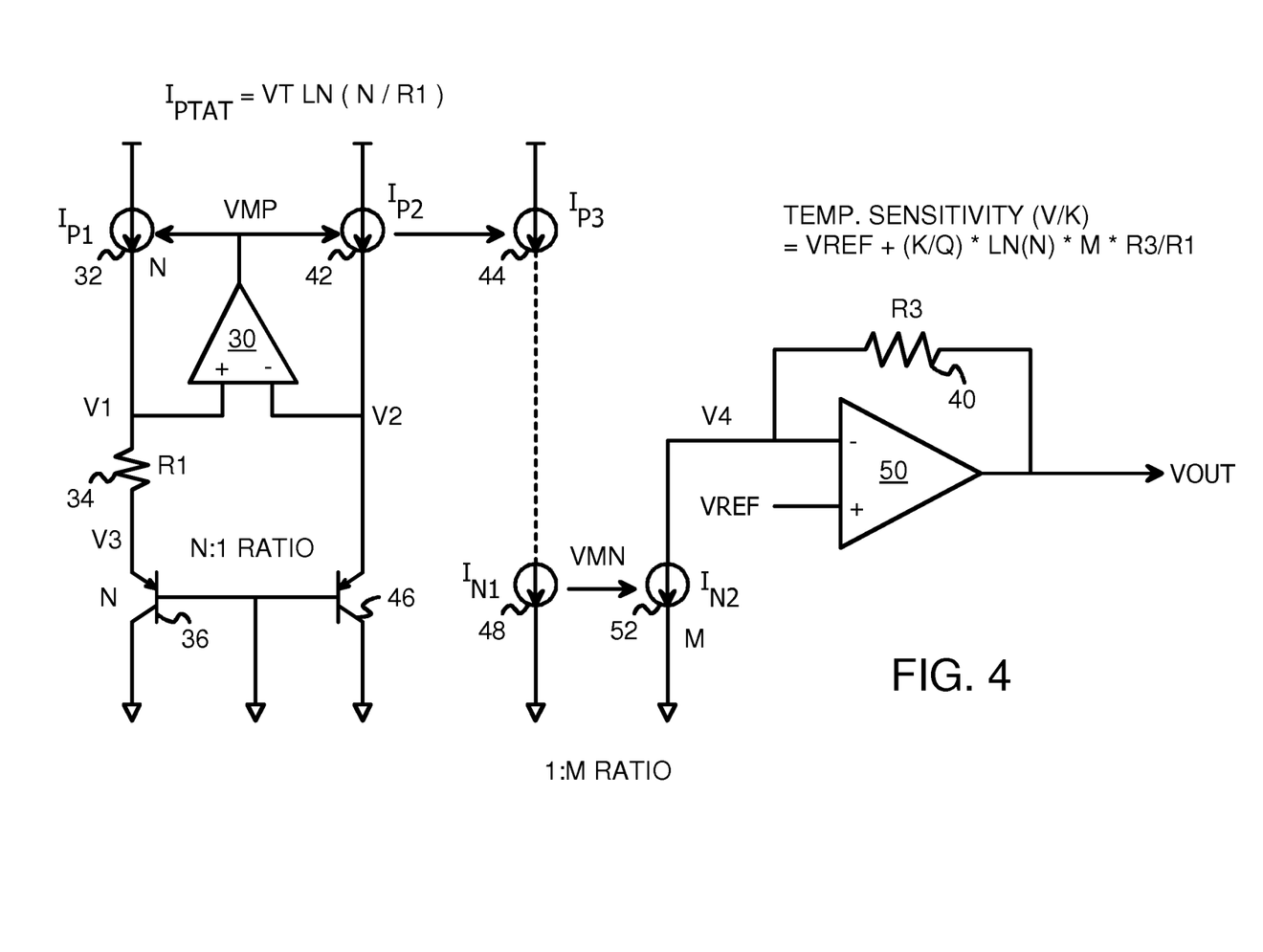
FIG. 4 is a diagram of a temperature sensor circuit that uses a difference in base-emitter voltages, and multiplies a mirrored current to cancel temperature non-linearities.

FIG. 4 is a diagram of a temperature sensor circuit that uses a difference in base-emitter voltages, and multiplies a mirrored current to cancel temperature non-linearities. PNP transistors 36, 46 can be transistors formed in a standard CMOS process. The collector currents and their base-emitter junction voltages are sensitive to temperature. The base-emitter voltage of transistor 46 is voltage V2, which is applied to the inverting input of error amplifier 30. The collector current through transistor 36 passes through scaling resistor 34, causing an additional voltage drop, increasing voltage V1 that is applied to the non-inverting input of error amplifier 30.

Error amplifier 30 adjusts bias voltage VMP in response to the difference in voltages V1, V2. Bias voltage VMP is applied to current sources 32, 42 to adjust their currents. Current source 32 generates current IP1 to scaling resistor 34 and transistor 36, while current source 42 generates current IP2 to transistor 46.

Since the collector currents of both transistors 36, 46 are dependent on saturation current $I_S$, which has a non-linear temperature dependency, the temperature dependencies due to the saturation current $I_S$ are cancelled by subtraction due to error amplifier 30. The resulting currents from current sources 32, 42, 44 depend on absolute temperature as:

$$I_{PTAT}=VT\ln(N)/R1$$

where VT is kT/q, R1 is the resistance of scaling resistor 34, ln is the natural logarithm function, and N is the ratio of the W/L sizes of transistors 36, 46, and of current sources 32, 42.

Bias voltage VMP is generated by error amplifier 30 and applied to current sources 32, 42, 44, causing them to each generate a current that is proportional to absolute temperature. The current IP3 mirrored by current source 44 is applied to current sink 48, which generates a bias voltage VMN that causes the sink current IN1 to be mirrored to current sink 52 as current IN2. Sink current IN2 is pulled through multiplier resistor 40, converting the mirrored current to a voltage, VOUT.

Amplifier 50 receives reference voltage VREF on its non-inverting input, and voltage V4 on its inverting input. Voltage V4 is between current sink 52 and multiplier resistor 40. Amplifier 50 sets the DC bias of VOUT to match VREF.

The output voltage VOUT is VREF plus the I*R drop through multiplier resistor 40, or $$VOUT=VREF+IN2*R3$$

$$VOUT=VREF+I_{PTAT}*M*R3$$

where M is the mirroring factor or ratio of the sizes of current sinks 52, 48.

$$VOUT=VREF+(kT/q)*\ln(N)*M*R3/R1$$

Thus the temperature sensitivity of VOUT in volts per degree Kelvin is:

$$Sensitivity(V/K)=VREF+(k/q)*\ln(N)*M*R3/R1$$

The temperature sensitivity is thus scaled by R3/R1, the ratio of multiplier resistor 40 to scaling resistor 34, and the mirroring factor M, and the natural log of the transistor size ratio N or transistors 36, 46. The circuit designer can chose these variables to achieve the desired temperature sensitivity of the circuit.

Operation

When V2 is higher than V1, error amplifier 30 reduces VMP, causing an increase in PMOS currents sourced by current sources 32, 42. This increased source current causes V1 to rise more than V2 due to scaling resistor 34.

Figure 5:
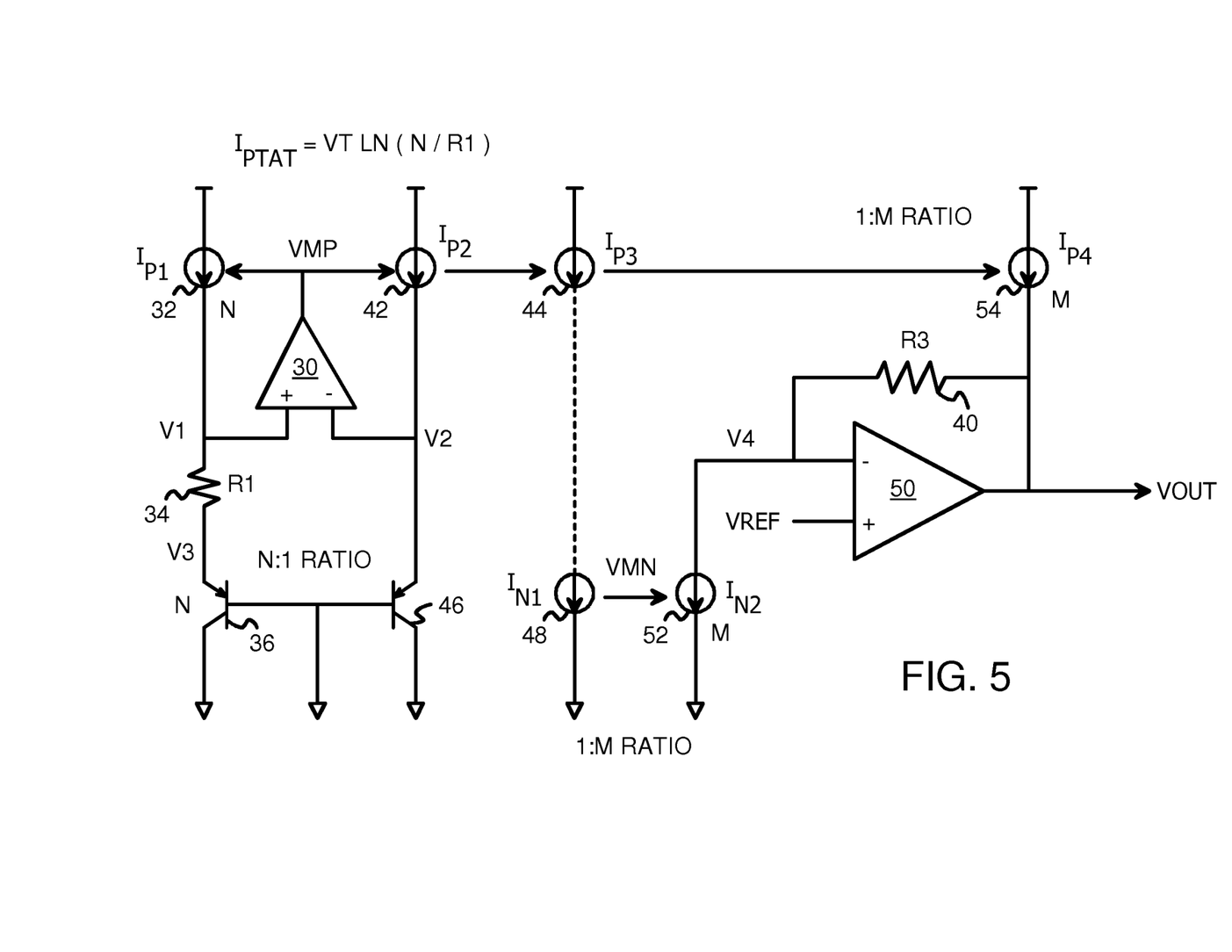
FIG. 5 is an alternative temperature sensor circuit having an output current source.

FIG. 5 is an alternative temperature sensor circuit having an output current source. Output current source 54 also receives bias voltage VMP and generates a current IP4 that is proportional to absolute temperature, without the non-linearities of the saturation current $I_S$ if transistors 36, 46. Output current source 54 is scaled in size by the scaling factor M. Output current source 54 provides a current IP4 that compensates for the sink current IN2 through current sink 52. This current compensation can increase the accuracy of the circuit and allows amplifier 50 to be a lower-current-drive or low power amplifier.

Figure 6:
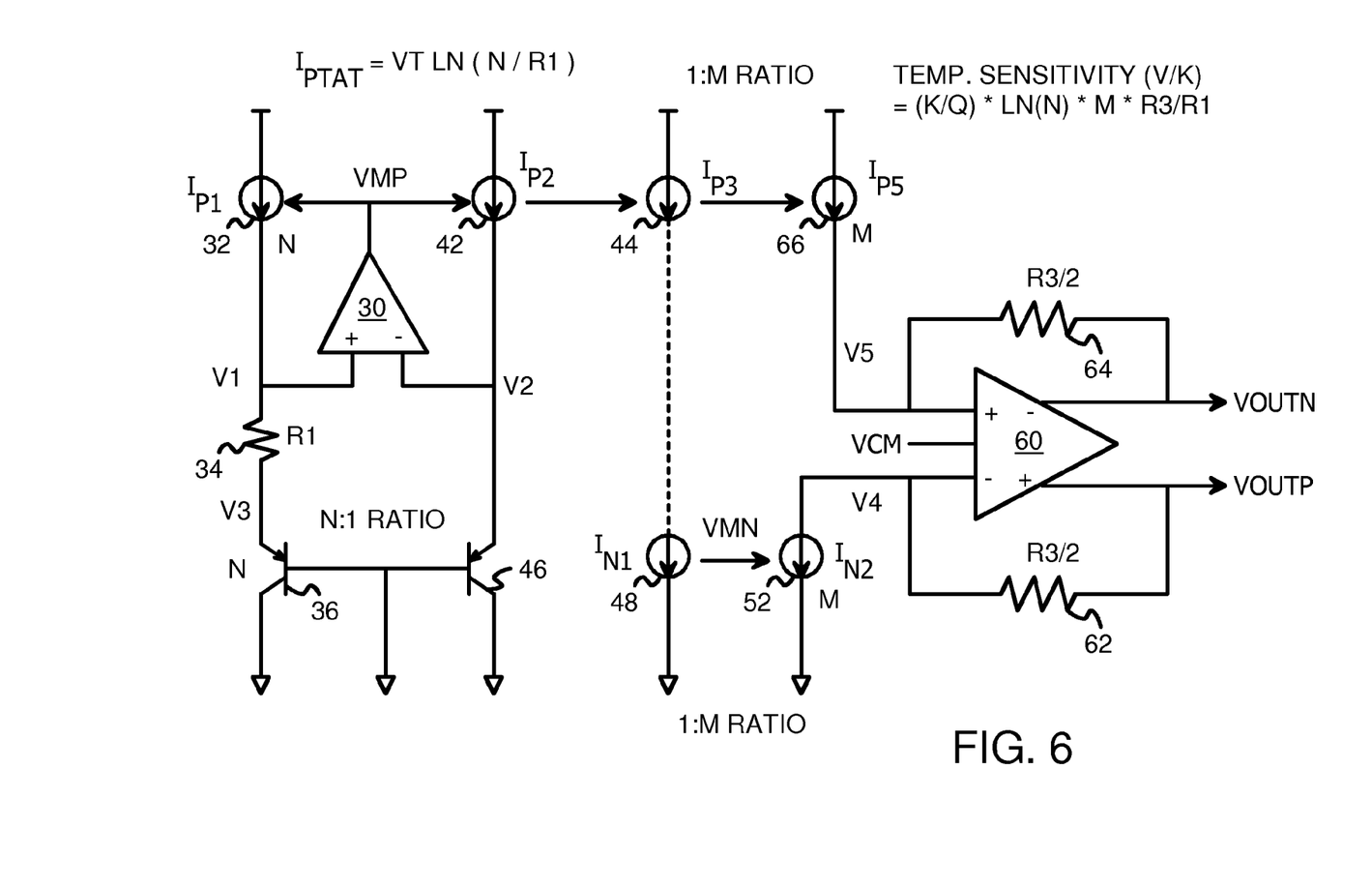
FIG. 6 shows a differential temperature sensor circuit.

FIG. 6 shows a differential temperature sensor circuit. Some applications may use a differential signal rather than a single-ended output VOUT as shown in FIGS. 4-5. Differential signal VOUTP, VOUTN carries the information of VOUT as a voltage difference rather than an absolute voltage. Differential signals are more noise immune and may enable the use of lower-power circuitry or lower supply voltages.

Amplifier 60 is a fully differential amp having positive and negative outputs that are relative to a common-mode input VCM. The inverting input to amplifier 60 receives voltage V4 that is between current sink 52 and half multiplier resistor 62. Rather than receive a reference voltage as in FIG. 4, the non-inverting input to amplifier 60 also receives a voltage V5. Voltage V5 is generated between current source 66 and half multiplier resistor 64. Current source 66 also receives bias voltage VMP and generates a current IP5 that is proportional to absolute temperature.

Half multiplier resistor 62 is connected between V4 and VOUTP, while half multiplier resistor 64 is connected between V5 and VOUTN. The resistance value of half multiplier resistor 62 is half of the value R3 of multiplier resistor 40, or R3/2. Likewise, resistance value of half multiplier resistor 64 is half of the value R3 of multiplier resistor 40, or R3/2. Thus the sum of the resistance values of half multiplier resistors 62, 64 is R3. The same temperature sensitivity equation applies for the differential sensor, but without the VREF term:

$$Sensitivity(V/K)=(k/q)*\ln(N)*M*R3/R1$$

Figure 7:
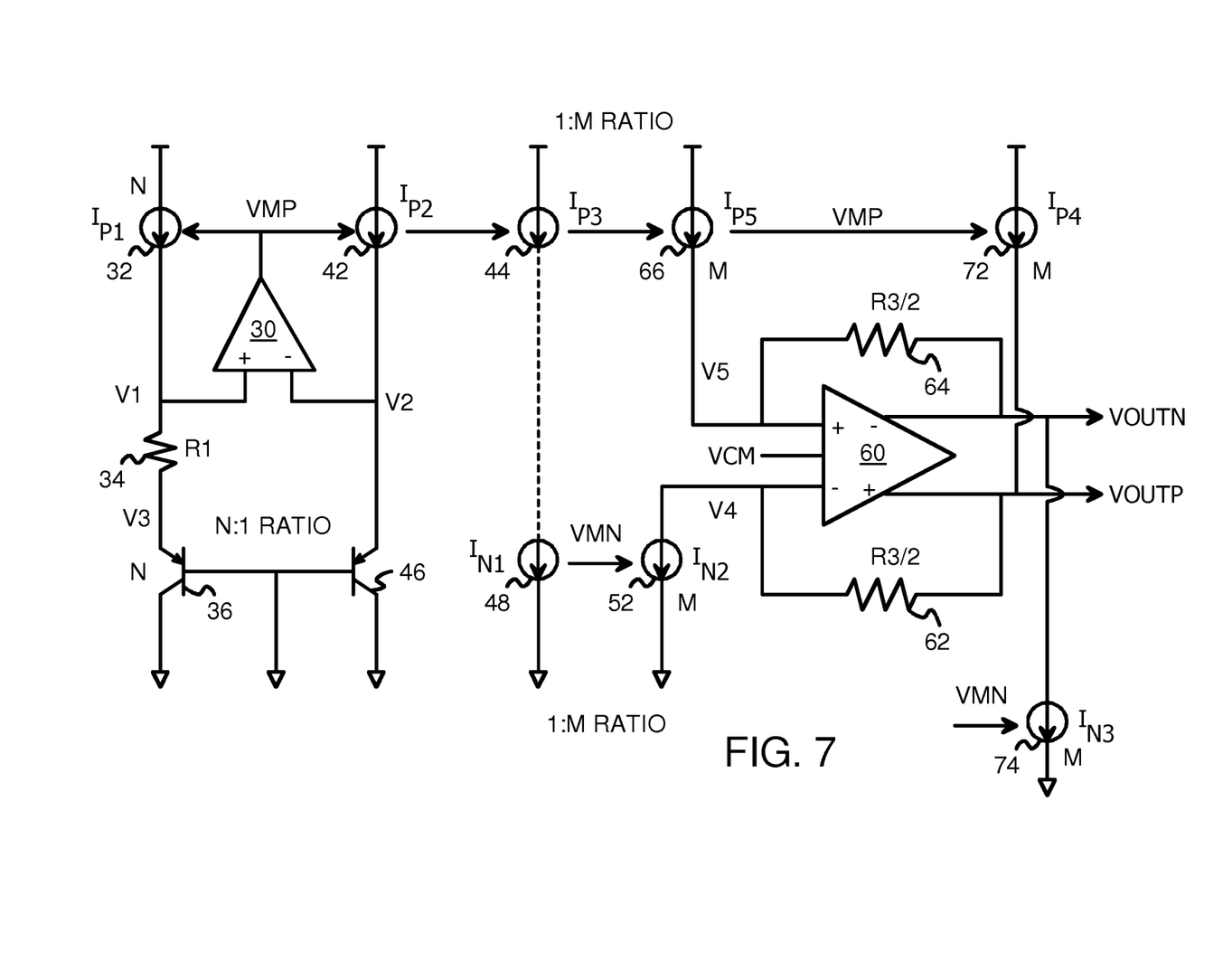
FIG. 7 shows a differential temperature sensor circuit with an output current source and sink.

FIG. 7 shows a differential temperature sensor circuit with an output current source and sink. Output current source 72 drives current IP4 to output VOUTP, and receives bias voltage VMP and has a mirror scaling factor of M. Output current sink 74 sinks current IN3 from output VOUTN, and receives bias voltage VMN and has a mirror scaling factor of M.

Accuracy may be improved using output current sources and sinks to compensate for currents IN2, IP5. A lower current drive may be achieved for amplifier 60, or a faster output switching speed may be obtained. The fully differential circuit may improve rejection of common-mode noise.

Figure 8:
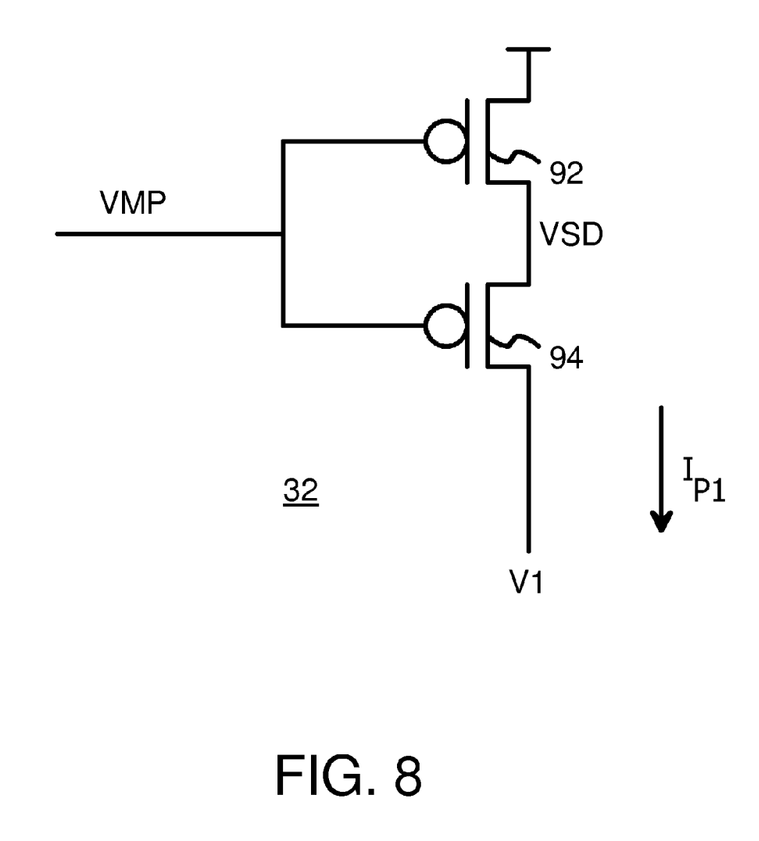
FIG. 8 is a diagram of a current source.

FIG. 8 is a diagram of a current source. Current source 32 of FIGS. 4-7, and other current sources, may be implemented as two p-channel transistors 92, 94 with their gates connected together to receive bias voltage VMP. The series connection of p-channel transistors 92, 94 between power and voltage V1 provides better isolation since intermediate node VSD is between transistors 92, 94 to block leakage currents. The substrate, well, or body terminals of p-channel transistors 92, 94 may be connected to the power supply or to some other body bias voltage.

Current sinks could be implemented in a similar manner using a series of two or more n-channel transistors. A single transistor could also be used as a current source or a current sink but provides less isolation.

ALTERNATE EMBODIMENTS

Several other embodiments are contemplated by the inventors. For example the common mode voltage VCM may be generated as a fixed reference voltage, or may be generated by averaging the difference of differential signals over a period of time, or by filtering or other methods. A start-up circuit to initially set voltages may be added. Multiple devices such as transistors or additional circuit legs in parallel may be added. The bipolar transistors 36, 46 could be lateral PNP transistors if a BiCMOS process were available, or could be vertical NPN transistors.

There may be additional transistors between current sources and sinks, such as between current source 44 and current sink 48, as shown by the dashed line in FIG. 4. While PNP transistors 36, 46 have been described, diodes could be used, or PNP or other kinds of transistors that have a junction that is temperature sensitive.

Buffers, inverters, gating logic, capacitors, resistors, or other elements may be added at various locations in the circuit for a variety of reasons unrelated to the invention, such as for power savings modes.

Signals may be encoded, compressed, inverted, combined, or otherwise altered. Clocks may be combined with other signals or conditions. The entire circuit or portions of it could be inverted and p-channel and n-channel transistors swapped, and inverting and non-inverting inputs to amplifiers swapped.

Directional terms such as upper, lower, up, down, top, bottom, etc. are relative and changeable as the system, circuit, or data is rotated, flipped over, etc. These terms are useful for describing the device but are not intended to be absolutes. Signals may be active high or active low, and may be inverted, buffered, encoded, qualified, or otherwise altered.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. The final sizes of transistors and capacitors may be selected after circuit simulation or field testing. Metal-mask options or other programmable components may be used to select the final capacitor, resistor, or transistor sizes.

P-channel rather than n-channel transistors (or vice-versa) may be used for some technologies or processes, and inversions, buffers, capacitors, resistors, gates, or other components may be added to some nodes for various purposes and to tweak the design. Timings may be adjusted by adding delay lines or by controlling delays. Separate power supplies and grounds may be used for some components. Various filters could be added. Active low rather than active high signals may be substituted.

While positive currents have been described, currents may be negative or positive, as electrons or holes may be considered the carrier in some cases. Source and sink currents may be interchangeable terms when referring to carriers of opposite polarity. Currents may flow in the reverse direction. A fixed bias voltage may be switched to power or ground to power down the circuit.

While Complementary-Metal-Oxide-Semiconductor (CMOS) transistors have been described, other transistor technologies and variations may be substituted, and materials other than silicon may be used, such as Galium-Arsinide (GaAs) and other variations.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A temperature sensor circuit comprising:
a first junction that produces a first voltage on a first node that is sensitive to temperature;
a scaling resistor coupled between the first node and a first sense node;
a first current source for sourcing a first current to the first sense node in response to a bias voltage;
a second junction that produces a second voltage on a second node that is sensitive to temperature;
a second current source for sourcing a second current to the second node in response to the bias voltage;
an error amplifier that compares the first sense node to the second node to generate the bias voltage;
a third current source for sourcing a third current in response to the bias voltage;
a first current sink that sinks the third current to generate a second bias voltage that adjusts the first current sink to sink the third current;
a second current sink that receives the second bias voltage and generates a sink current that is sunk from a multiplier node;
a multiplier resistor coupled between multiplier node and an output; and
an amplifier having the multiplier node as a first input and a receiving a reference voltage as a second input, the amplifier driving the output in response to a voltage difference between the reference voltage and a voltage on the multiplier node.

2. The temperature sensor circuit of claim 1 wherein the output indicates a temperature of the first junction and the second junction.

3. The temperature sensor circuit of claim 2 wherein the output has a sensitivity to temperature that is scaled by a ratio of a resistance of the multiplier resistor to a resistance of the scaling resistor.

4. The temperature sensor circuit of claim 3 further comprising:
a fourth current source for sourcing a third current in response to the bias voltage, wherein the third current is delivered to the output.

5. The temperature sensor circuit of claim 3 wherein the first junction is a PNP transistor having a grounded base and a grounded collector and an emitter connected to the first node;
wherein the second junction is a PNP transistor having a grounded base and a grounded collector and an emitter connected to the second node.

6. The temperature sensor circuit of claim 3 wherein the second current sink is M times larger than the first current sink, wherein M is a mirroring factor of at least one;
wherein the output is sensitive to temperature in proportion to M.

7. The temperature sensor circuit of claim 3 wherein the first, second and third current source each comprise:
a first transistor having a channel connected between a power supply and an intermediate node, and having a gate receiving the bias voltage;
a second transistor having a channel connected between the intermediate node and a current-delivering node, and having a gate receiving the bias voltage;
wherein a current sourced by the current source is sourced to the current-delivering node, whereby the first and second transistors are in series.

8. The temperature sensor circuit of claim 7 wherein the first transistor is a p-channel transistor the second transistor is a p-channel transistor.

9. The temperature sensor circuit of claim 3 wherein the first junction is N times larger than the second junction, wherein N is greater than zero.

10. The temperature sensor circuit of claim 9 wherein the output is sensitive to temperature in proportion to a natural logarithm of N.

11. A temperature sensor comprising:
first junction means for generating a first voltage on a first node that is sensitive to temperature;
a scaling resistor coupled between the first node and a first sense node;
first current source means for sourcing a first current to the first sense node in response to a bias voltage;
second junction means for generating a second voltage on a second node that is sensitive to temperature;
second current source means for sourcing a second current to the second node in response to the bias voltage;
error amplifier means for comparing the first sense node to the second node to generate the bias voltage;
third current source means for sourcing a third current in response to the bias voltage;
first current sink means for sinking the third current to generate a second bias voltage that adjusts the first current sink to sink the third current;
second current sink means, receiving the second bias voltage, for generating a sink current that is sunk from a multiplier node;
a multiplier resistor coupled between multiplier node and an output; and
amplifier means, receiving the multiplier node and a reference voltage, for driving the output in response to a voltage difference between the reference voltage and a voltage on the multiplier node;
wherein the output indicates a temperature and has a sensitivity to temperature that is scaled by a ratio of a resistance of the multiplier resistor to a resistance of the scaling resistor.

12. The temperature sensor of claim 11 wherein the first junction means generates a current that is N times larger than a current generated by the second junction means, wherein N is greater than zero;
wherein the first current source means is N times larger than the second current source means;
wherein the output is sensitive to temperature in proportion to a natural logarithm of N.

13. The temperature sensor of claim 11 wherein the second current sink means is M times larger than the first current sink means, wherein M is a mirroring factor of at least one;
wherein the output is sensitive to temperature in proportion to M.

14. The temperature sensor of claim 13 wherein the amplifier means further comprises means for driving the output to a DC bias determined by the reference voltage and independent of a temperature sensitivity set by a ratio of the resistance of the multiplier resistor to a resistance of the scaling resistor, whereby DC bias is set independently of temperature sensitivity.

* * * * *